United States Patent [19]

Kawano et al.

[11] Patent Number: 5,424,550
[45] Date of Patent: Jun. 13, 1995

[54] CHARGED PARTICLE BEAM EXPOSURE APPARATUS

[75] Inventors: Masamichi Kawano, Mito; Masahide Okumura, Sagamihara; Haruo Yoda, Tokyo; Yukinobu Shibata, Ibaraki; Tadao Konishi, Mito, all of Japan

[73] Assignees: Hitachi, Ltd.; Hitachi Instrument Engineering Co., Ltd., both of Tokyo, Japan

[21] Appl. No.: 183,770

[22] Filed: Jan. 21, 1994

Related U.S. Application Data

[63] Continuation of Ser. No. 763,145, Sep. 20, 1991, Pat. No. 5,281,827.

[30] Foreign Application Priority Data

Sep. 21, 1990 [JP] Japan ................ 2-250277

[51] Int. Cl.⁶ ................................. H01J 37/302
[52] U.S. Cl. ............................................. 250/492.22
[58] Field of Search ............... 250/492.2, 492.22, 398, 250/492.3

[56] References Cited

U.S. PATENT DOCUMENTS 4,261,762 4/1981 King .
4,985,634 1/1991 Stengl et al. .
5,281,827 1/1994 Kawano et al. ............... 250/492.2

FOREIGN PATENT DOCUMENTS 56-165443 12/1981 Japan .
57-204131 12/1982 Japan .
60-246131 12/1985 Japan .
61-9040 1/1986 Japan .

OTHER PUBLICATIONS

T. H. P. Chang et al., "Electron-beam lithography draws a finer line", *Electronics*, vol. 50, No. 10, May 12, 1977, pp. 89–96.

*Primary Examiner*—Jack I. Berman
*Attorney, Agent, or Firm*—Antonelli, Terry, Stout & Kraus

[57] ABSTRACT

A charged particle beam exposure apparatus includes an irradiator for irradiating a sample with a charged particle beam, an analog controller for analog controlling the charged particle beam, a digital controller for digital controlling the analog controller, and a digital transmission path connecting the analog controller to the digital controller. The analog controller is disposed inside a room, and the digital controller is disposed outside the room.

60 Claims, 2 Drawing Sheets

CHARGED PARTICLE BEAM EXPOSURE APPARATUS

This is a continuation of application Ser. No. 763,145, filed on Sep. 20, 1991, now U.S. Pat. No. 5,281,827.

BACKGROUND OF THE INVENTION

1. Field of the Invention

The present invention relates to a charged particle beam exposure apparatus, and particularly, to a charged particle beam exposure apparatus which is suitable for application to the manufacture of LSI's.

2. Description of the Related Art

There are two cases for the structure of a charged particle beam exposure apparatus, that is the case of integrating a main body of the apparatus (including a charged particle generator section and a sample carrier section) and a control unit for controlling these units, and the case of separating the main body of the apparatus from the control unit. In the case of separating these units, it is typical that the apparatus main body is separated from the control unit. In this case, it is necessary to have an analog signal cable wired from the control unit to the apparatus main body, with a maximum limit of about 10 m for the wiring distance between the two units. Further, in the case of integrating the apparatus main body and the control unit, an area for the installation of the apparatus is unnecessarily increased.

In order to minimize the necessary floor area within a clean room at the side of the user of the apparatus, it is desirable that only a portion requiring stable cleanliness, temperature and humidity the installed within the clean room. From this viewpoint, in the case of structuring the charged particle beam exposure apparatus by integrating the main body of the apparatus and the control unit, there is a problem that the floor area required for the installation of the apparatus within the clean room is unnecessarily increased. Further, in the case of separating the main body of the apparatus from the control unit to structure the charged particle beam exposure apparatus, there is a problem that the layout of the apparatus is constrained by the wiring of an analog signal cable.

As described above, there is a problem that constraints in the floor area and in the layout of the apparatus are imposed on the user of the apparatus, because no consideration has been given either to reduce the floor area for the installation of the apparatus in the clean room or to guarantee the layout of the apparatus with a high degree of freedom to match the idea of the configuration of the manufacturing line at the side of the user of the apparatus.

SUMMARY OF THE INVENTION

It is an object of the present invention to provide a charged particle beam exposure apparatus which is dividedly disposed within and outside the clean room so as to reduce the floor area required for the installation of the apparatus within the clean room and which is suitable for having a long distance between the portions of the divided installation of the apparatus.

According to one aspect of the present invention, a charged particle beam exposure apparatus is provided which comprises a main body section including means for generating a charged particle beam, means for irradiating a sample with the charged particle beam, and means for controlling both the deflection of the charged particle beam and the irradiation of the sample with the charged particle beam; means for analog controlling the deflection and irradiation control means; and means for digital controlling the analog control means, the main body section and the analog control means being disposed within a clean room of a clean room area that comprises the clean room and a space under the floor thereof and the digital control means being disposed outside the clean room.

According to another aspect of the present invention, a charged particle beam exposure apparatus is provided which comprises a main body section including means for generating a charged particle beam, means for irradiating a sample with the charged particle beam and means for controlling both the deflection of the charged particle beam and the irradiation of the sample with the charged particle beam; means for analog controlling the deflection and irradiation control means; and means for digital controlling the analog control means, the main body section being disposed within a clean room of a clean room area comprising the clean room and a space under the floor therefor, the analog control means being disposed in the space under the floor and the digital control means being disposed outside the clean room.

Other objects of the present invention and their characteristics will be clear from the following description to be made with reference to the accompanying drawings.

DESCRIPTION OF THE PREFERRED EMBODIMENT

Figure 1:
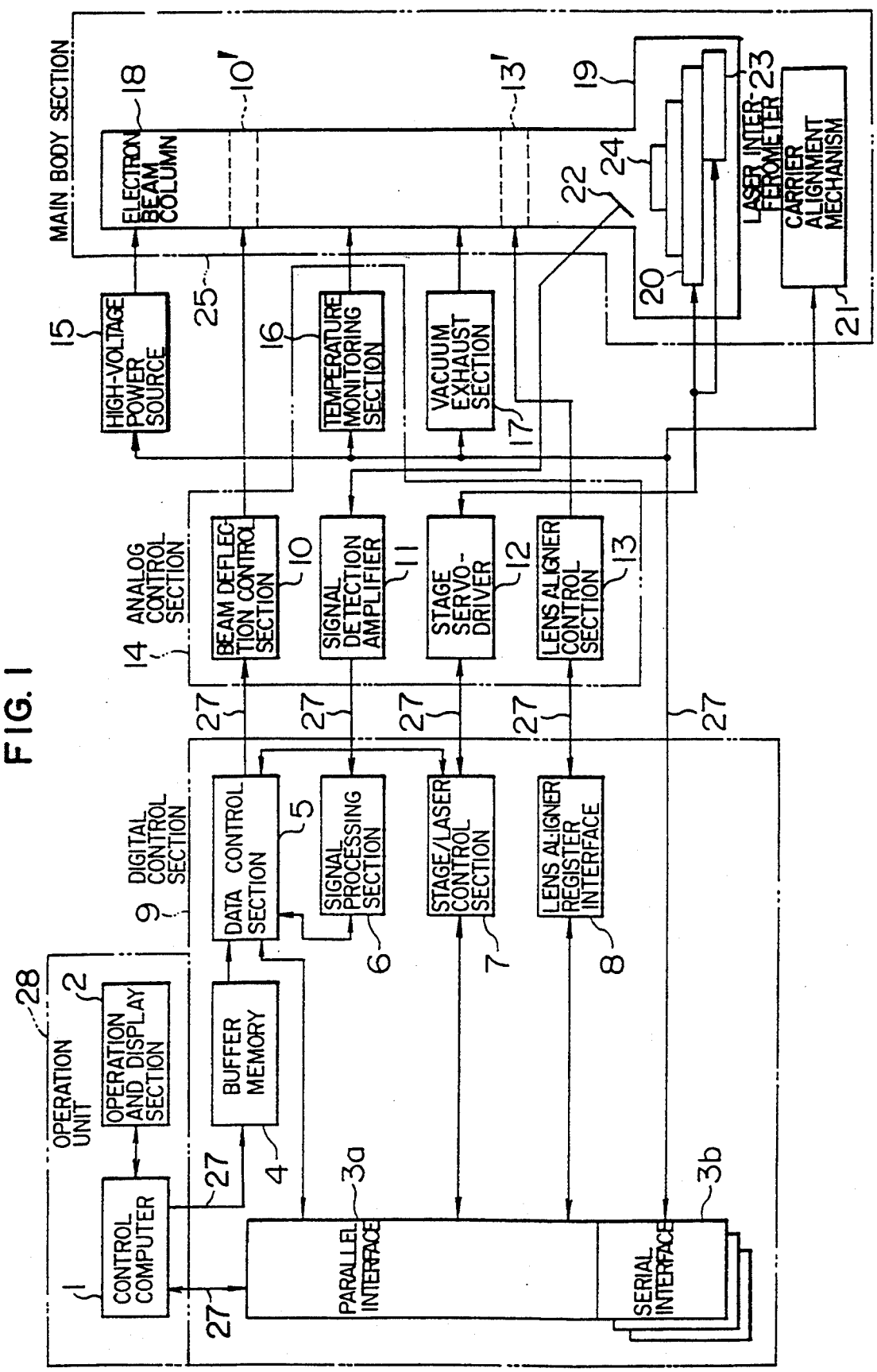
FIG. 1 is a block of a charged particle beam exposure apparatus showing one embodiment according to the present invention.

Referring to FIG. 1, a control computer 1 supplies data and instructions to each section of the apparatus in accordance with the input of an operation and display section 2. The control computer 1 transfers drawing data to a buffer memory 4 and then starts a data control section 5 through a parallel interface 3a. The data control section 5 sequentially reads the drawing data from the buffer memory 4, breaks down the drawing data into drawing data which enables a drawing to be formed with an electron beam, and then generates digital data for deflecting and turning on and off an electron beam. The digital data is then transferred to a beam deflection control section 10. The beam deflection control section 10 generates an analog signal for beam deflection and on/off control through a digital/analog converter and an amplifier by using the digital data from the data control section 5.

A deflector and blanker 10' for deflecting and turning on and off an electron beam within an electron beam column 18 are controlled by the signal generated by the beam deflection control section 10, and a sample wafer 24 is irradiated with the electron beam which is discharged from an electron gun applied with a high voltage by a high-voltage power source 15.

In the case of drawing an LSI pattern with of an electron beam, it is typical that the LSI pattern is drawn on a wafer 24 on which a drawing pattern has already been drawn. In order to accurately match and expose a predetermined position on the wafer to the electron beam, it is necessary to determine the relative positional relationship in the X, Y and Z directions between the wafer and the electron beam by accurately detecting a reference mark on the wafer and the height of the wafer before drawing the LSI pattern. The reference mark on the wafer and the height of the wafer can be detected by utilizing an electron beam and a light beam. A signal including information about these items is obtained from a detector 22, amplified by a signal detection amplifier 11, and processed to accurately extract positional information by a signal processing section 6. The information processed by the signal processing section 6 is read by the control computer 1 through the parallel interface 3a and is utilized to draw the LSI pattern by superposition. The signal processing section 6 is started by a command of the control computer 1 dispatched by the data control section 5.

Prior to drawing the LSI pattern, it is necessary to align the electron beam within the electron beam column 18 in the X, Y and Z directions. The data for alignment is supplied to a lens aligner control section 13 by the control computer 1 through the parallel interface 3a and a lens aligner register interface 8. Based on the alignment data, the lens aligner control section 13 generates analog data for controlling an electron lens and aligner 13' within the electron beam column 18 through a digital/analog converter and an amplifier.

A stage 20 for holding the wafer 24 is kept in a vacuum in a sample chamber 19 and is moved together with the drawing to make it possible to draw within a range covering an area larger than an electron beam deflection range. A stage position is measured by a laser interferometer 23. The control computer 1 instructs starting of the stage 20 and reading of a laser beam from the laser interferometer 23 to a stage/laser control section 7 through the parallel interface 3a. The stage/laser control section 7 generates a stage operation pattern by referring to a stage position outputted from the laser interferometer 23. A stage servo-driver 12 generates an analog drive signal for controlling the stage 20 from the stage operation pattern generated and servo-controls the stage 20.

Through a serial interface 3b, the control computer 1 controls a carrier alignment mechanism section 21 such as a loader and the like for mounting and dismounting the wafer 24 to and from the stage 20, a vacuum exhaust section 17 for vacuum exhausting the electron beam column 18 and the sample chamber 19 through a vacuum valve, the high-voltage power source 15 and a temperature monitoring section 16 for monitoring the temperature of each portion of the main body.

Data indicating the states of various portions such as the position of the stage, a current value (a set value) of the electron lens, the current position of the wafer, the open and close state of the vacuum valve, etc., are serially transferred to the operation and display section 2 and are displayed in this section.

In the above configuration, as shown in FIG. 1, the control computer 1 and the operation display section 2 are provided in one operation unit 28 which can be divided, the parallel interface 3a, the serial interface 3b, the buffer memory 4, the data control section 5, the signal processing section 6, the stage/laser control section 7 and the lens aligner register interface 8 are grouped in a digital control section 9, and the beam deflection control section 10, the signal detection amplifier 11, the stage servo-driver 12, the lens aligner control section 13 and the temperature monitoring section 16 are grouped in an analog control section 14. The high-voltage power source 15 and the vacuum exhaust section 17 are associated with the main body, and the electron beam column 18, the sample chamber 19, the stage 20, the laser interferometer 23 and the carrier alignment mechanism 21 constitute a main body.

In this case, the control computer 1 and the digital control section 9, and the digital control section 9 and the analog control section 14, are connected with each other by a parallel or serial digital transmission path 27. Particularly, deflection data and beam blanking data are parallel transferred between the data control section 5 and the beam deflection control section 10 and a parallel transfer period can be varied in accordance with conditions for irradiating the electron beam.

The digital transmission path 27 is provided by the combination of a current driver and a wire cable, or an optical fiber performing optical conversion, to enable a cable wiring with a length of 50 m to 100 m.

Figure 2:
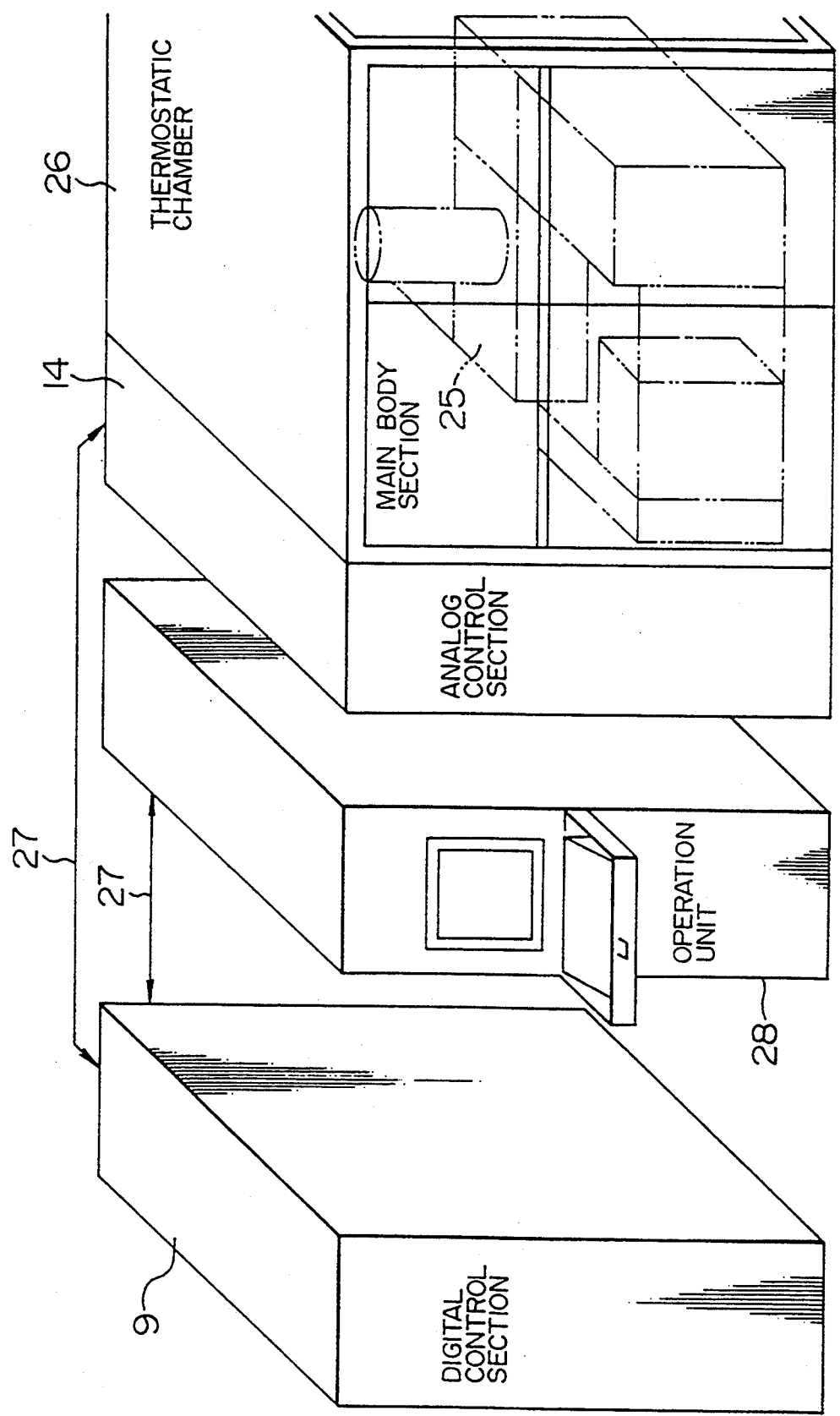
FIG. 2 is a perspective view of the apparatus shown in FIG. 1 according to one embodiment of the present invention.

An example of the configuration of an apparatus according to the present invention is shown in FIG. 2.

The main body section 25 is accommodated in a thermostatic chamber 26 and the analog control section 14 is disposed adjacent to the main body section. The thermostatic chamber 26 accommodating the main body section 25 and the analog control section 14 are disposed within a clean room. The digital control section 9 can be freely layed out within the distance of 50 m to 100 m, for example in a space under the floor of the clean room or outside the clean room. The control computer 1 and the operation display section 2 are provided in the operation unit 28. The operation unit 28 can also be freely layed out within the distance of 50 m to 100 m. The operation unit can have any format such as a rack mount, disk top or disk side, and can be disposed in a desired format near the main body section or within the clean room, to facilitate the use of the operation unit. By this arrangement, a flexible use of the operation unit is made possible to match the idea of the user of the apparatus.

According to the present embodiment, the operation unit 28 and the digital control section 9 can be disposed at the outside of the clean room within the distance of 50 m to 100 m so that the charged particle beam exposure apparatus can be disposed to meet the idea of the manufacturing line at the side of the user of the apparatus. Further, the digital control section a and the operation unit 28 can be disposed at a remote place, so that the floor area required for installing the apparatus in the clean room can be reduced. Further, the digital control section a and the beam deflection control section 10 are connected with each other by the digital parallel transmission path 27, with a parallel transfer period being set to be variable in accordance with conditions for irradiating the electron beam, so that the productivity can be improved and it becomes possible to draw LSI patterns with resists having various levels of photosensitivity.

It is needless to mention that the analog control section 14 can be disposed beneath the clean room if it is near the main body so that the floor area within the clean room can be reduced further.

We claim:

1. A charged particle beam exposure apparatus, comprising:
   irradiating means for irradiating a sample with a charged particle beam;
   analog control means for analog controlling the charged particle beam;

digital control means for digital controlling the analog control means; and
a digital transmission path connecting the analog control means to the digital control means;
wherein the analog control means is disposed inside a room, and the digital control means is disposed outside the room.

2. A charged particle beam exposure apparatus according to claim 1, wherein
the digital transmission path includes a parallel digital transmission path, and
parallel digital data is transferred between the analog control means and the digital control means over the parallel digital transmission path.

3. A charged particle beam exposure apparatus according to claim 2, wherein the parallel digital data is transferred between the analog control means and the digital control means over the parallel digital transmission path during a variable parallel transfer period.

4. A charged particle beam exposure apparatus according to claim 1, wherein the irradiating means is disposed inside the room.

5. A charged particle beam exposure apparatus according to claim 1, further comprising data transmitting means for transmitting data to the digital control means.

6. A charged particle beam exposure apparatus according to claim 5, wherein the data transmitting means is disposed outside the room.

7. A charged particle beam exposure apparatus according to claim 5, wherein the data transmitting means is disposed inside the room.

8. A charged particle beam exposure apparatus according to claim 1, further comprising operation and display means for transmitting operating data for operating the irradiating means to the digital control mean, and for displaying data indicating states of portions of the irradiating means.

9. A charged particle beam exposure apparatus according to claim 8, wherein the operation and display means is disposed outside the room.

10. A charged particle beam exposure apparatus according to claim 8, wherein the operation and display means is disposed inside the room.

11. A charged particle beam exposure apparatus according to claim 8, wherein
the digital transmission path includes a parallel digital transmission path,
parallel digital data is transferred between the analog control means and the digital control means over the parallel digital transmission path, and
serial digital data indicating states of portions of the irradiating means is transferred from the irradiating means and the analog control means to the operation and display means via the digital transmission path and the digital control means.

12. A charged particle beam exposure apparatus according to claim 11, wherein the parallel digital data is transferred between the analog control means and the digital control means over the parallel digital transmission path during a variable parallel transfer period.

13. A charged particle beam exposure apparatus, comprising:
an irradiator for irradiating a sample with a charged particle beam;
an analog controller for analog controlling the charged particle beam;
a digital controller for digital controlling the analog controller; and
a digital transmission path connecting the analog controller to the digital controller;
wherein the analog controller is disposed inside a room, and the digital controller is disposed outside the room.

14. A charged particle beam exposure method, comprising the steps of:
disposing analog control means for analog controlling a charged particle beam inside a room;
disposing digital control means for digital controlling the analog control means outside the room;
connecting the analog control means to the digital control means with a digital transmission path;
irradiating a sample with a charged particle beam with irradiating means;
analog controlling the charged particle beam with the analog control means; and
digital controlling the analog control means with the digital control means.

15. A charged particle beam exposure method according to claim 14, wherein
the digital transmission path includes a parallel digital transmission path, and
the method further comprises the step of
transferring parallel digital data between the analog control means and the digital control means over the parallel digital transmission path.

16. A charged particle beam exposure method according to claim 15, wherein
the parallel digital data is transferred between the analog control means and the digital control means over the parallel digital transmission path during a parallel transfer period, and
the method further comprises the step of
varying the parallel transfer period.

17. A charged particle beam exposure method according to claim 14, further comprising the step of disposing the irradiating means inside the room.

18. A charged particle beam exposure method according to claim 14, further comprising the step of transmitting data to the digital control means with data transmitting means.

19. A charged particle beam exposure method according to claim 18, further comprising the step of disposing the data transmitting means outside the room.

20. A charged particle beam exposure method according to claim 18, further comprising the step of disposing the data transmitting means inside the room.

21. A charged particle beam exposure method according to claim 14, further comprising the step of transmitting operating data for operating the irradiating means to the digital control mean and displaying data indicating states of portions of the irradiating means with operation and display means.

22. A charged particle beam exposure method according to claim 21, further comprising the step of disposing the operation and display means outside the room.

23. A charged particle beam exposure method according to claim 21, further comprising the step of disposing the operation and display means inside the room.

24. A charged particle beam exposure method according to claim 21, wherein
the digital transmission path includes a parallel digital transmission path, and
the method further comprises the steps of transferring parallel digital data between the analog control means and the digital control means over the parallel digital transmission path, and transferring serial digital data indicating states of portions of the irradiating means from the irradiating means and the analog control means to the operation and display means via the digital transmission path and the digital control means.

25. A charged particle beam exposure method according to claim 24, wherein the parallel digital data is transferred between the analog control means and the digital control means over the parallel digital transmission path during a parallel transfer period, and the method further comprises the step of varying the parallel transfer period.

26. A charged particle beam exposure method, comprising the steps of:

disposing an analog controller for analog controlling a charged particle beam inside a room;

disposing a digital controller for digital controlling the analog controller outside the room;

connecting the analog controller to the digital controller with a digital transmission path;

irradiating a sample with a charged particle beam with an irradiator;

analog controlling the charged particle beam with the analog controller; and digital controlling the analog controller with the digital controller.

27. A charged particle beam exposure apparatus, comprising:

irradiating means for irradiating a sample with a charged particle beam;

analog control means for controlling the charged particle beam with analog control signals;

digital control means for controlling the analog control means with digital control signals; and a digital transmission path connecting the digital control means to the analog control means for transmitting the digital control signals between the digital control means and the analog control means;

wherein the analog control means is disposed inside an enclosed space, and the digital control means is disposed outside the enclosed space.

28. A charged particle beam exposure apparatus according to claim 27, wherein the analog control means includes means for converting the digital control signals into the analog control signals.

29. A charged particle beam exposure apparatus according to claim 27, wherein the digital control signals include digital control signals in the form of parallel digital data, the digital transmission path includes a parallel digital transmission path, and the parallel digital data is transmitted between the digital control means and the analog control means over the parallel digital transmission path.

30. A charged particle beam exposure apparatus according to claim 29, wherein the parallel digital data is transmitted between the digital control means and the analog control means over the parallel digital transmission path during a variable parallel transfer period.

31. A charged particle beam exposure apparatus according to claim 27, wherein the irradiating means is disposed inside the enclosed space.

32. A charged particle beam exposure apparatus according to claim 27, further comprising data transmitting means for transmitting data to the digital control means.

33. A charged particle beam exposure apparatus according to claim 32, wherein the data transmitting means is disposed outside the enclosed space.

34. A charged particle beam exposure apparatus according to claim 32, wherein the data transmitting means is disposed inside the enclosed space.

35. A charged particle beam exposure apparatus according to claim 27, further comprising operation and display means for transmitting operating data for operating the irradiating means to the digital control means, and displaying data indicating states of portions of the irradiating means.

36. A charged particle beam exposure apparatus according to claim 35, wherein the operation and display means is disposed outside the enclosed space.

37. A charged particle beam exposure apparatus according to claim 35, wherein the operation and display means is disposed inside the enclosed space.

38. A charged particle beam exposure apparatus according to claim 35, wherein the digital control signals include digital control signals in the form of parallel digital data, the digital transmission path includes a parallel digital transmission path and a serial digital transmission path, the parallel digital data is transmitted between the digital control means and the analog control means over the parallel digital transmission path, and serial digital data indicating states of portions of the irradiating means is transmitted between the irradiating means and the operation and display means, and between the analog control means and the operation and display means, via the serial digital transmission path and the digital control means.

39. A charged particle beam exposure apparatus according to claim 38, wherein the parallel digital data is transmitted between the digital control means and the analog control means over the parallel digital transmission path during a variable parallel transfer period.

40. A charged particle beam exposure apparatus, comprising:

an irradiator for irradiating a sample with a charged particle beam;

an analog controller for controlling the charged particle beam with analog control signals;

a digital controller for controlling the analog controller with digital control signals; and a digital transmission path connecting the digital controller to the analog controller for transmitting the digital control signals between the digital controller and the analog controller;

wherein the analog controller is disposed inside an enclosed space, and the digital controller is disposed outside the enclosed space.

41. A charged particle beam exposure apparatus according to claim 40, wherein the analog controller includes means for converting the digital control signals into the analog control signals.

42. A charged particle beam exposure method, comprising the steps of:

disposing analog control means for controlling a charged particle beam with analog control signals inside an enclosed space;

disposing digital control means for controlling the analog control means with digital control signals outside the enclosed space;

connecting the digital control means to the analog control means with a digital transmission path for transmitting the digital control signals between the digital control means and the analog control means;

irradiating a sample with a charged particle beam with irradiating means;

controlling the charged particle beam with the analog control means; and controlling the analog control means with the digital control means.

43. A charged particle beam exposure method according to claim 42, wherein the analog control means includes means for converting the digital control signals into the analog control signals.

44. A charged particle beam exposure method according to claim 42, wherein the digital control signals include digital control signals in the form of parallel digital data, the digital transmission path includes a parallel digital transmission path, and the method further comprises the step of transmitting the parallel digital data between the digital control means and the analog control means over the parallel digital transmission path.

45. A charged particle beam exposure method according to claim 44, wherein the parallel digital data is transmitted between the digital control means and the analog control means over the parallel digital transmission path during a parallel transfer period, and the method further comprises the step of varying the parallel transfer period.

46. A charged particle beam exposure method according to claim 42, further comprising the step of disposing the irradiating means inside the enclosed space.

47. A charged particle beam exposure method according to claim 42, further comprising the step of transmitting data to the digital control means with data transmitting means.

48. A charged particle beam exposure method according to claim 47, further comprising the step of disposing the data transmitting means outside the enclosed space.

49. A charged particle beam exposure method according to claim 47, further comprising the step of disposing the data transmitting means inside the enclosed space.

50. A charged particle beam exposure method according to claim 42, further comprising the step of transmitting operating data for operating the irradiating means to the digital control means, and displaying data indicating states of portions of the irradiating means, with operation and display means.

51. A charged particle beam exposure method according to claim 50, further comprising the step of disposing the operation and display means outside the enclosed space.

52. A charged particle beam exposure method according to claim 50, further comprising the step of disposing the operation and display means inside the enclosed space.

53. A charged particle beam exposure method according to claim 50, wherein the digital control signals include digital control signals in the form of parallel digital data, the digital transmission path includes a parallel digital transmission path and a serial digital transmission path, and the method further comprises the steps of transmitting the parallel digital data between the digital control means and the analog control means over the parallel digital transmission path, and transmitting serial digital data indicating states of portions of the irradiating means between the irradiating means and the operation and display means, and between the analog control means and the operation and display means, via the serial digital transmission path and the digital control means.

54. A charged particle beam exposure method according to claim 53, wherein the parallel digital data is transmitted between the digital control means and the analog control means over the parallel digital transmission path during a parallel transfer period, and the method further comprises the step of varying the parallel transfer period.

55. A charged particle beam exposure method, comprising the steps of:

disposing an analog controller for controlling a charged particle beam with analog control signals inside an enclosed space;

disposing a digital controller for controlling the analog controller with digital control signals outside the enclosed space;

connecting the digital controller to the analog controller with a digital transmission path for transmitting the digital control signals between the digital control means and the analog control means;

irradiating a sample with a charged particle beam with an irradiator;

controlling the charged particle beam with the analog controller; and controlling the analog controller with the digital controller.

56. A charged particle beam exposure method according to claim 55, wherein the analog controller includes means for converting the digital control signals into the analog control signals.

57. An apparatus comprising:

a device to be controlled;

analog control means for controlling the device to be controlled with analog control signals;

digital control means for controlling the analog control means with digital control signals; and a digital transmission path connecting the digital control means to the analog control means for transmitting the digital control signals between the digital control means and the analog control means;

wherein the analog control means is disposed inside an enclosed space, and the digital control means is disposed outside the enclosed space.

58. An apparatus according to claim 57, wherein the apparatus is a charged particle beam exposure apparatus; and wherein the device to be controlled is irradiating means for irradiating a sample with a charged particle beam.

59. A method comprising the steps of:

disposing analog control means for controlling a device to be controlled with analog control signals inside an enclosed space;

disposing digital control means for controlling the analog control means with digital control signals outside the enclosed space;

connecting the digital control means to the analog control means with a digital transmission path for transmitting the digital control signals between the digital control means and the analog control means;

controlling the device to be controlled with the analog control means; and controlling the analog control means with the digital control means.

60. A method according to claim 59, wherein the method is a charged particle beam exposure method;

wherein the device to be controlled is irradiating means for irradiating a sample with a charged particle beam; and wherein the method further comprises the step of irradiating the sample with the charged particle beam with the irradiating means.

* * * * *